United States Patent [19]

Toyomaki

[11] 4,404,479
[45] Sep. 13, 1983

[54] SAMPLE-AND-HOLD CIRCUIT

[75] Inventor: Kazuya Toyomaki, Yokohama, Japan

[73] Assignee: Victor Company of Japan, Limited, Yokohama, Japan

[21] Appl. No.: 247,973

[22] Filed: Mar. 26, 1981

[30] Foreign Application Priority Data

Mar. 27, 1980 [JP] Japan .................................. 55-39215

[51] Int. Cl.³ .............................................. G11C 27/02
[52] U.S. Cl. .................................... 307/353; 328/151
[58] Field of Search ................. 307/352, 353; 328/151

[56] References Cited

U.S. PATENT DOCUMENTS

| | | | |
|---|---|---|---|
| 3,304,506 | 2/1967 | Weekes | 328/151 |
| 3,480,795 | 11/1969 | Benson et al. | 328/151 |
| 4,091,297 | 5/1978 | Stephens | 307/353 |

OTHER PUBLICATIONS

Electronic Design, vol. 23, Nov. 8, 1978, Rochelle Park, N.J., U.S., "Designing with a Sample–hold won't be a Problem if You Use the Right Circuit", pp. 84–89.
Technische Mitteilungen, AEG-Telefunken, No. 60, 6, 1970, Berlin, DE, Schein, D: "Elektronische Langzeitspeicher für Analogen Grössen", pp. 379–383.
IEEE Spectrum, Jun. 1971, vol. 8, No. 6, New York, U.S., J. Naylor: "Digital and Analog Signal Applications of Operational Amplifiers", pp. 38–46.

Primary Examiner—John Zazworsky
Attorney, Agent, or Firm—Lowe, King, Price & Becker

[57] ABSTRACT

In a sample-and-hold circuit having two voltage amplifiers connected in series via a switch, which is arranged to perform on-off operations in accordance with a control signal, the noninverting input terminal of the second voltage amplifier of output side is grounded so that the switch can be used at an imaginal short point of the second voltage amplifier. As a result, a semiconductor switch having a simple construction may be used as the switch, while a switch drive circuit may also be simple. Furthermore, since great negative feedback effect can be attained during sampling mode, the sample-and-hold circuit is capable of operating with high accuracy. Additional switches may be employed for improving feedthrough characteristics, while means for preventing undesirable oscillation may be provided if necessary.

6 Claims, 6 Drawing Figures

SAMPLE-AND-HOLD CIRCUIT

FIELD OF THE INVENTION

This invention generally relates to a sample-and-hold circuit which is used for sampling an analog signal to effect analog-to-digital conversion, and more particularly, the present invention relates to improvement in characteristics of sample-and-hold circuits.

BACKGROUND OF THE INVENTION

Some conventional sample-and-hold circuits have suffered from a problem that the variation in operation impedance of an analog switch included therein affects the output signal, while undesirable phenomena, such as droop and feedthrough, are apt to occur. In another type of conventional sample-and-hold circuits, although the above-mentioned drawbacks are removed, it is required to employ a switch drive circuit having a complex construction, while only limited elements can be used as the analog switch of the sample-and-hold circuit. Another conventional circuit arrangement for a sample-and-hold circuit has suffered from a drawback that the variation in operating impedance, i.e. the impedance during on-state of an analog switch included therein affects the output signal in the same mamner as the first mentioned one although some other disadvantages have been resolved.

Summarizing the prior art in connection with sample-and-hold circuits for sampling an input analog signal, it can be said that none of the conventional circuit arrangements was satisfactory because each of the conventional arrangements has suffered from at least one disadvantage as set forth hereinabove.

SUMMARY OF THE INVENTION

The present invention has been developed in order to remove the above-mentioned disadvantages and drawbacks inherent to the conventional circuit arrangements for sample-and-hold circuits.

It is, therefore, a primary object of the present invention to provide a sample-and-hold circuit which has superior characteristics providing high accuracy compared to the conventional sample-and-hold circuit.

A feature of the present invention is to provide a sample-and-hold circuit which is simple in construction.

Another feature of the present invention is to provide a sample-and-hold circuit in which distortion due to the variation in operating impedance of an analog switch made of a semiconductor element does not affect the output signal thereof.

A further object of the present invention is to provide a sample-and-hold circuit which is free from undesirable phenomena, such as droop and feedthrough.

In accordance with the present invention, there is provided a sample-and-hold circuit, comprising: (a) a first voltage amplifier having a noninverting input terminal connected via a first resistor to an input terminal of said sample-and-hold circuit, an inverting input terminal connected to ground, and an output terminal; (b) a second voltage amplifier having an inverting input terminal connected via a switch to said output terminal of said first voltage amplifier, a noninverting input terminal connected to ground, and an output terminal connected to an output terminal of said sample-and-hold circuit; (c) a hold capacitor interposed between said inverting input terminal and said output terminal of said second voltage amplifier; and (d) a second resistor interposed between said noninverting input terminal of said first voltage amplifier and said output terminal of said second voltage amplifier.

In accordance with the present invention there is also provided a sample-and-hold circuit comprising: (a) a first voltage amplifier having a noninverting input terminal connected via a first resistor to an input terminal of said sample-and-hold circuit, an inverting input terminal connected via a second resistor to ground, and an output terminal; (b) a second voltage amplifier having an inverting input terminal connected via a first switch to said output terminal of said first voltage amplifier, a noninverting input terminal connected to ground, and an output terminal connected to an output terminal of said sample-and-hold circuit; (c) a hold capacitor interposed between said inverting input terminal and said output terminal of said second voltage amplifier; (d) a third resistor interposed between said noninverting input terminal of said first voltage amplifier and said output terminal of said second voltage amplifier; (e) a second switch interposed between said inverting input terminal and said output terminal of said first voltage amplifier, and arranged to perform on-off operations in opposite manner with respect to said first switch; and (f) a third switch interposed between said noninverting input terminal of said first voltage amplifier and ground, and arranged to perform on-off operations in opposite manner with respect to said first switch.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE PREFERRED EMBODIMENTS

Prior to describing the preferred embodiments of the present invention, some conventional sample-and-hold circuits will be described for a better understanding of the object and features of the present invention.

Sample-and-hold circuits used for sampling an analog signal are usually constructed of a semiconductor switch, such as an FET, diode switch or the like, which functions as an analog switch, a hold capacitor, amplifiers and so on.

Figure 1:
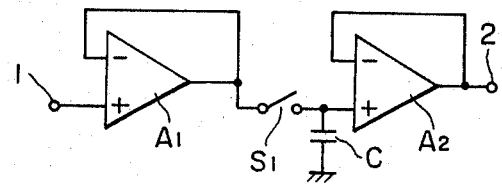
FIGS. 1 to 3 are circuit diagrams of typical conventional sample-and-hold circuits.
Figure 2:
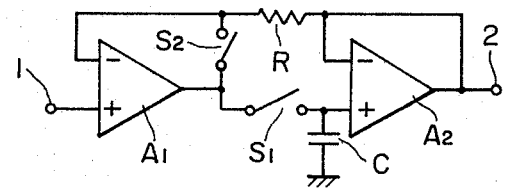
Figure 3:
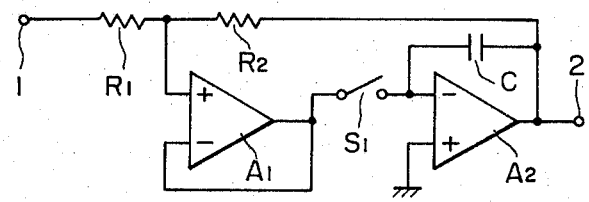

FIG. 1 to FIG. 3 are circuit diagrams of typical examples of conventional sample-and-hold circuits, and in FIGS. 1 to 3, a reference numeral 1 is a signal input terminal; 2, an output terminal for sampled signals; $S_1$, a switch; C, a hold capacitor; $A_1$ and $A_2$, amplifiers; R, $R_1$ and $R_2$, resistors; and $S_2$, a switch.

The sample-and-hold circuit of FIG. 1 is arranged such that an analog signal applied to the signal input terminal 1 is amplified by the amplifier $A_1$, and then is applied to the switch $S_1$ (analog switch), which is arranged to perform on-off operations in such a manner that it assumes on-state during sampling mode and off-state during holding mode, so that sampling from the analog signal is effected when the switch $S_1$ is in on-state, and the sampled value is held in the hold capacitor C when the switch $S_1$ is in off-state, and the held signal is emitted via the amplifier $A_2$ to the output terminal 2.

The conventional sample-and-hold circuit of FIG. 1 has suffered from various problems. Namely, distortion due to the variations in operating impedance of the switch $S_1$ in a state of conduction thereof appears in the output signal as is, while undesirable droop, i.e. a phenomenon that a sampled value varies because of decrease in charge stored in the hold capacitor C, and by other reasons, and feedthrough, i.e. a phenomenon that the input signal appears in the output signal as is, have occurred.

In another example of a conventional sample-and-hold circuit of FIG. 2, the inverting input terminals of the amplifiers $A_1$ and $A_2$ in the above-described example of FIG. 1, are connected to each other via a resistor R while a switch $S_2$, which performs opposite on-off operations with respect to the switch $S_1$, is interposed between the output terminal and the noninverting input terminal of the amplifier $A_1$. With this arrangement, the gain of the amplifier $A_1$ is increased in sampling mode because of the off-state of the switch $S_2$ during sampling mode, and thus distortion due to the variation in the operating impedance in on-state of the switch $S_1$, which resides in the negative feedback loop, does not greatly affect the output signal, while feedthrough is reduced because the level of the input signal applied to the switch $S_1$ in holding mode lowers by the on-state of the switch $S_2$ in holding mode. However, since the switch $S_1$ is not used at an imaginal short point of the amplifier $A_2$, there have been drawbacks such that one having a simple construction cannot be used as a switch drive circuit (switch control circuit), while there is a limit with respect to element(s) used as the switch $S_1$.

Furthermore, the conventional sample-and-hold circuit of FIG. 3 is constructed such that a hold capacitor C is connected between the output terminal and the inverting input terminal of the amplifier $A_2$; and a series circuit of resistors $R_1$ and $R_2$ is connected between the output terminal of the amplifier $A_2$ and the signal input terminal 1; a junction connecting the resistors $R_1$ and $R_2$ is connected to the noninverting input terminal of the amplifier $A_1$; and a switch $S_1$ is interposed between the output terminal of the amplifier $A_1$ and the inverting input terminal of the amplifier $A_2$. In the conventional sample-and-hold circuit of FIG. 3, since the switch $S_1$ is used at an imaginal short point of the amplifier $A_2$, a junction FET, whose coupling capacitance with respect to a control signal is small, can be readily used as the switch $S_1$. In spite of such an advantage, however, there has been a drawback such that distortion due to the variation in the operating impedance of the switch $S_1$ during the on-state of the switch $S_1$ in sampling mode appears in the output signal as is.

The present invention has been developed in order to provide a sample-and-hold circuit, which is capable of resolving the various problems inherent to the conventional sample-and-hold circuits described in the above, and circuit arrangements of the sample-and-hold circuit according to the present invention will be described in detail with reference to accompanying drawings.

Figure 4:
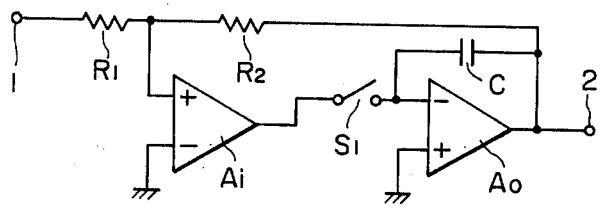
FIGS. 4 to 6 are schematic circuit diagrams of the sample-and-hold circuits according to the present invention, where each represents an embodiment of the invention.
Figure 5:
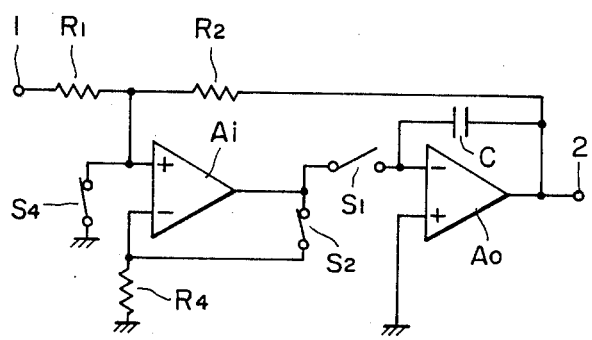
Figure 6:
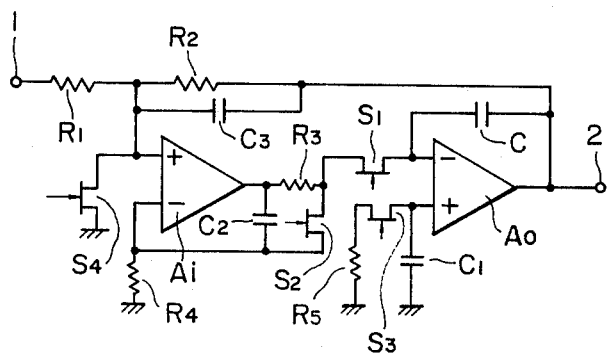

FIG. 4 and FIG. 5 are circuit diagrams for showing the constructional principle of the sample-and-hold circuit according to the present invention, and FIG. 6 is a circuit diagram showing a detailed structure of the sample-and-hold circuit according to the present invention.

In FIGS. 4 to 6, a reference $A_i$, is a voltage amplifier of input side; and, $A_o$, a voltage amplifier of output side; and in the sample-and-hold circuit of FIG. 4 and FIG. 5, the noninverting input terminal of the voltage amplifier $A_o$ of output side is grounded, while a hold capacitor C is interposed between the output terminal and the inverting input terminal of the voltage amplifier $A_o$ of output side.

Between the output terminal 2 and the signal input terminal 1 is interposed a series circuit of resistors $R_2$ and $R_1$, and a connecting node between the resistors $R_1$ and $R_2$ is connected to the noninverting input terminal of the voltage amplifier $A_i$ of input side. Between the output terminal of the voltage amplifier $A_i$ of input side and the inverting input terminal of the voltage amplifier $A_o$ of output side is connected a switch $S_1$ (analog switch). The inverting input terminal of the voltage amplifier $A_i$ of input side is grounded in the sample-and-hold circuit of FIG. 4, and is connected to ground via a resistor $R_4$ in the sample-and-hold circuit of FIG. 5.

In the sample-and-hold circuit of FIG. 5, in addition to the above-mentioned elements, a switch $S_4$ is provided between the noninverting input terminal of the voltage amplifier $A_i$ of input side and ground, while a switch $S_2$ is provided between the output terminal and the inverting input terminal of the voltage amplifier $A_i$ of input side. The switches $S_2$ and $S_4$ are both driven so that they perform opposite on-off operations with respect to the on-off operations of the swtich $S_1$, and thus the switch $S_1$ becomes on and the switches $S_2$ and $S_4$ become off in sampling mode, while the switch $S_1$ becomes off and the switches $S_2$ and $S_4$ become on in holding mode.

In the sample-and-hold circuit of FIG. 6, junction FETs are used as the respective switches $S_1$, $S_2$ and $S_4$ of the sample-and-hold circuit of FIG. 5; a capacitor $C_1$ having the same electrostatic capacitance as that of the hold capacitor C is connected between the noninverting input terminal of the voltage amplifier $A_o$ of output side and ground; a series circuit of a junction FET, which functions as a switch $S_3$, and a resistor $R_5$ is connected in parallel with the above-mentioned capacitor $C_1$; furthermore, a capacitor $C_2$ is connected between the output terminal and the inverting input terminal of the voltage amplifier $A_i$ of input side, and a resistor $R_3$ is connected between the output terminal of the voltage amplifier $A_i$ of input side and the switch $S_1$, so that phase compensation of the negative feedback loop is effected by the above-mentioned capacitor $C_2$ and the resistor $R_3$; and furthermore, the band width of the sample-and-hold circuit is limited by connecting a capacitor $C_3$ in parallel with the resistor $R_2$ which constitutes a negative feedback loop. The switch $S_1$ and the switch $S_3$ are selected so that the characteristics thereof are equal to each other, and are driven so as to perform concurrent on-off operations, while the resistor $R_3$ and $R_5$ are selected so that the resistances thereof are equal to each other. As a result, the circuits respectively connected to the noninverting input terminal and the inverting input terminal of the amplifier $A_o$ of output side are equivalent to each other, and thus offset, which occurs by the leak of the signal through the switch $S_1$, is cancelled, while improvement with respect to droop can be attained.

In the sample-and-hold circuit of the present invention, since the switch $S_1$ is used at the imaginal short point of the voltage amplifier $A_o$ of output side, the switch drive circuit (switch control circuit) may be simple in construction; a simple switching element, such as a junction EFT, may be used as the switch $S_1$; while an element having a small coupling capacitance with respect to the control signal can be used. In sampling mode, since the loop gain of the negative feedback amplifier, which is constructed of the voltage amplifier $A_i$ of the input side, the switch $S_1$, the voltage amplifier $A_o$ of output side, the resistors $R_1$ and $R_2$, and others, becomes adequately great, output signal distortion due to the variation in the operating impedance in on-state of the switch $S_1$ included in the negative feedback loop will be remarkably reduced by great negative feedback effect; and according to the sample-and-hold circuit of the present invention a sample-and-hold circuit having highly accurate characteristic can be readily provided.

It will be apparent that feedthrough is improved if switches $S_2$ and $S_4$, which become on in holding mode, are provided in the sample-and-hold circuit of FIG. 5 or in the sample-and-hold circuit of FIG. 6. For the improvement in feedthrough characteristic, the switch $S_4$ may not be necessarily used, while only the switch $S_2$ is used. In practice, a diode pair (parallel arrangement of two diodes connected in the reverse direction with respect to each other) may be used in place of each of the switches $S_2$ and $S_4$.

When constructing the sample-and-hold circuits of FIG. 4 and FIG. 5, voltage amplifiers, which have been arranged in advance not to oscillate, are used as the respective ones $A_i$ and $A_o$, so that oscillation would not occur when a single negative feedback amplifier is constituted under the condition that the two voltage amplifiers $A_i$ and $A_o$ are connected in series.

On the other hand, in the case that voltage amplifiers, such as general purpose operational amplifiers, which are not arranged to prevent oscillation in advance, are used, it is a matter of course that means for preventing oscillation (the capacitor $C_2$ and $C_3$, and the resistor $R_3$) have to be adopted as shown in the circuit of the FIG. 6.

As will be apparent from the above-detailed description, in the sample-and-hold circuit of the present invention, it is possible to readily provide a sample-and-hold circuit having high accuracy by a simple means, without suffering from the drawbacks inherent to the conventional devices.

The above-described embodiments are just examples of the present invention, and therefore, it will be apparent for those skilled in the art that many modifications and variations may be made without departing from the spirit of the present invention.

What is claimed is:

1. A sample-and-hold circuit comprising:
 (a) a first voltage amplifier having a noninverting input terminal connected via a first resistor to an input terminal of said sample-and-hold circuit, an inverting input terminal connected via a second resistor to ground, and an output terminal;
 (b) a second voltage amplifier having an inverting input terminal connected via a first switch to said output terminal of said first voltage amplifier, a noninverting input terminal connected to ground, and an output terminal connected to an output terminal of said sample-and-hold circuit;
 (c) a hold capacitor interposed between said inverting input terminal and said output terminal of said second voltage amplifier;
 (d) a third resistor interposed between said noninverting input terminal of said first voltage amplifier and said output terminal of said second voltage amplifier;
 (e) a second switch interposed between said inverting input terminal and said output terminal of said first voltage amplifier, and arranged to perform on-off operations in opposite manner with respect to said first switch; and
 (f) a third switch interposed between said noninverting input terminal of said first voltage amplifier and ground, and arranged to perform on-off operations in opposite manner with respect to said first switch.

2. A sample-and-hold circuit as claimed in claim 1, wherein said first to third switches are junction FETs arranged to perform on-off operations in accordance with a control signal applied thereto.

3. A sample-and-hold circuit as claimed in claim 1, further comprising means for compensating for phase deviation to prevent oscillation in the sample-and-hold circuit, said means comprising a capacitor interposed between said inverting input terminal and said output terminal of said first voltage amplifier, and a resistor through which said first and second switches are connected to said output terminal of said first voltage amplifier.

4. A sample-and-hold circuit as claimed in claim 1, further comprising a capacitor connected in parallel with said third resistor so as to limit the band width of the sample-and-hold circuit.

5. A sample-and-hold circuit as claimed in claim 1, further comprising a capacitor interposed between said noninverting input terminal of said second voltage amplifier and ground, and a series circuit of a fourth switch and a resistor, which series circuit is connected in parallel with said capacitor connected to said noninverting input terminal of said second voltage amplifier, said fourth switch performs the same on-off operations as said first switch.

6. A sample-and-hold circuit as claimed in claim 5, wherein said fourth switch is a junction FET arranged to perform on-off operation in accordance with a control signal applied thereto.

* * * * *